(12) United States Patent
Taylor

(10) Patent No.: US 6,888,409 B1
(45) Date of Patent: May 3, 2005

(54) HIGH EFFICIENCY RF POWER AMPLIFIER

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/688,705

(22) Filed: Oct. 17, 2003

(51) Int. Cl.$^7$ ................................................ H03F 3/04
(52) U.S. Cl. ........................................ 330/297; 330/285
(58) Field of Search ........................... 330/297, 285, 330/296, 302, 264, 290, 277

(56) References Cited

U.S. PATENT DOCUMENTS

| | | | | |
|---|---|---|---|---|
| 6,148,220 A | * | 11/2000 | Sharp et al. ................. | 455/572 |
| 6,646,511 B2 | * | 11/2003 | Canyon et al. ............. | 330/297 |
| 6,825,725 B1 | * | 11/2004 | Doherty et al. ............. | 330/289 |

OTHER PUBLICATIONS

Kennington, Peter B., "High–Linearity RF Amplifier Design", *Artech House, Inc., Norwood, MA*, section 3.10, (2000),124.

Krauss, Herbert, et al., "Solid State Radio Engineering", *John Wiley & Sons, Inc., New York*, section 14–6,(1980), 468.

Maclean, Kenneth, et al., "A 610mW Zero–Overhead Class G Full–Rate ADSL Central–Office Line Driver", *2003 IEEE International Solid–State Circuits Conference*, Session 23, Paper 23.4,(2003),10 pages.

* cited by examiner

*Primary Examiner*—Henry Choe
(74) *Attorney, Agent, or Firm*—Law Offices of John C. Scott, LLC

(57) ABSTRACT

A radio frequency (RF) power amplification system uses multiple DC power sources to achieve efficient operation. In at least one embodiment, linear operation is maintained by appropriately selecting a reference voltage at which a secondary power source is activated.

23 Claims, 4 Drawing Sheets

HIGH EFFICIENCY RF POWER AMPLIFIER

FIELD OF THE INVENTION

The invention relates generally to solid state amplifiers and, more particularly, to radio frequency (RF) power amplifiers.

DETAILED DESCRIPTION

Figure 1:
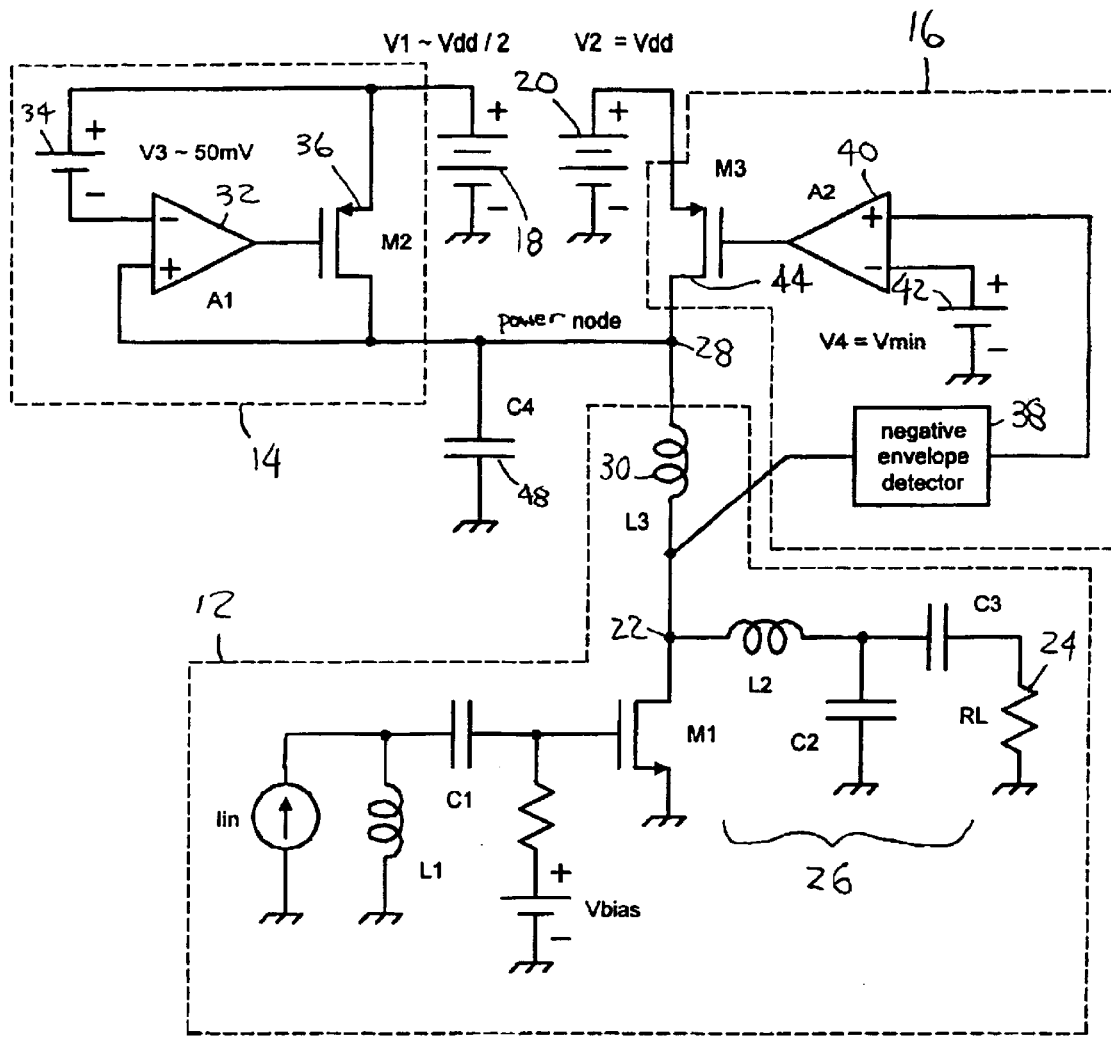
FIG. 1 is a schematic diagram illustrating an example radio frequency power amplification system in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a schematic diagram illustrating an example radio frequency (RF) power amplification system 10 in accordance with an embodiment of the present invention. As illustrated, the power amplification system 10 may include one or more of the following: a power amplifier 12, a switch circuit 14, and a regulator circuit 16. During operation, the power amplifier 12 may generate an envelope varying RF signal on an output node 22 thereof. The envelope varying RE signal may include, for example, an amplitude modulated (AM) signal, a signal having some other form of envelope modulation, a constant amplitude output signal that may experience changes in power level, and/or any other form of RF signal for which the envelope may vary with time. The RF output signal may be delivered to a load resistance ($R_L$) 24 through an output circuit 26. The load resistance 24 may represent any of a wide range of structures and will typically depend upon the application. In a transmitter application, for example, the load resistance 24 may include an antenna that will be used to wirelessly transmit the RF output signal to a remote location. Any type of antenna may be used including, for example, a dipole, a helix, a patch, an array, and/or others. The RF power amplification system 10 may be used in any application where an RF power amplifier is needed.

The output node 22 of the power amplifier 12 may be connected to a power node 28 through an inductor (L3) 30 or some other component that can provide a relatively high impedance at the RF frequencies and a relatively low impedance at envelope frequencies (e.g., a quarter wave transmission line section, etc.) and that can 10 supply DC current to the power amplifier 12. In at least one embodiment, an inductor is used between the output node 22 and the power node 28 that forms a part of an output matching arrangement with components of the output circuit 26. The power node 28 is a connection point through which power may be supplied to the power amplifier 12. The switch circuit 14 is connected between a first power source 18 and the power node 28. The regulator circuit 16 is connected between a second power source 20 and the power node 28. The first and second power sources 18, 20 are each operative for providing a direct current (DC) voltage having a predetermined voltage level to the system 10. Any form of DC power source may be used including, for example, batteries, DC power supplies, and/or others. In the illustrated embodiment, a single-stage insulated gate field effect transistor (IGFET) power amplifier is used. It should be appreciated, however, that any of a wide range of different power amplifier types (e.g., multiple stage, cascode, common gate, etc.) and/or transistor types (e.g., junction FETs, bipolar junction transistors (BJTs), silicon transistors, gallium arsenide (GaAs) transistors, etc.) may be used in other embodiments. A shunt capacitor (C4) 48 may be coupled between the power node 28 and a common node (e.g., ground) that presents a relatively low impedance (e.g., a short circuit) to RF energy and a relatively high impedance (e.g., an open circuit) to energy at the envelope frequencies to reduce power dissipation in the power amplification system 10.

The switch circuit 14 maintains a connection between the power node 28 and the first power source 18 during periods when the amplitude of the envelope of the RF output signal on the output node 22 of the power amplifier 12 is relatively low. As will be described in greater detail, the regulator circuit 16 is operative for controllably coupling the power node 28 to the second power source 20 during higher amplitude portions (e.g., peak portions) of the envelope of the RF output signal. During these higher amplitude portions of the RF envelope, the regulator circuit 16 may regulate the voltage on the power node 28 and therefore the output node 22 to prevent the voltage on the output node 22 from falling substantially below a predetermined minimum voltage level. The switch circuit 14 may decouple the power node 28 from the first power source 18 during all or part of the time that the second power source 20 is delivering current thereto.

In at least one embodiment of the present invention, the first power source 18 provides a lower voltage level than the second power source 20. For example, the first power source 18 may provide a voltage level that is approximately one-half that of the second power source 20. During periods of operation when only the lower voltage level first power source 18 is providing power to the amplification system 10, the power consumed by the system 10 will be significantly less than during periods when the second power source 20 is providing power (i.e., because of the lower voltage level). In this manner, enhanced operational efficiency may be achieved. This enhanced operational efficiency will be even more pronounced in systems that utilize signaling schemes having a large peak to average ratio (e.g., 64 quadrature amplitude modulation (QAM) orthogonal frequency division multiplexing (OFDM), etc.). In addition, in at least one embodiment, the regulator circuit 16 may be configured in a manner that preserves the linearity of operation of the amplification system 10, even during the higher magnitude portions of the envelope of the RF output signal.

In the embodiment illustrated in FIG. 1, the switch circuit 14 includes: a first control amplifier 32, a first voltage reference 34, and a switching device 36. Similarly, the regulator circuit 16 includes: a negative envelope detector 38, a second control amplifier 40, a second voltage reference ($V_{MIN}$) 42, and an amplifying device 44. In the illustrated embodiment, the switching device 36 is a P-type IGFET (e.g., a P-type metal-oxide-semiconductor field effect transistor (MOSFET), also known as PMOS). It should be appreciated, however, that many other types of switching devices may alternatively be used including, for example, other types of transistors, complementary metal oxide semiconductor (CMOS) switches, and/or others. In at least one embodiment, for example, an N-type MOSFET (also known as NMOS) is used for the switching device 36. NMOS devices can typically be implemented within a smaller die area than PMOS devices (i.e., less area for the same "on" resistance). In the illustrated embodiment, the amplifying device 44 within the regulator circuit 16 is also a P-type IGFET. Other types of transistors and/or amplifiers may alternatively be used. In at least one embodiment, for example, an NMOS device is used for the amplifying device 44 (although this may require the addition of a bootstrap circuit). The first and second control amplifiers 32, 40 may include, for example, operational amplifiers, differential amplifiers, amplifiers having moderate gain, and/or others.

The negative envelope detector 38 within the regulator circuit 16 detects the negative envelope of the RF signal on the output node 22 of the power amplifier 12. The second control amplifier 40 compares the negative envelope output by the negative envelope detector 38 to the second reference voltage ($V_{MIN}$) 42 and generates a control signal for delivery to the amplifying device 44 based on the comparison result. When the negative envelope is greater than the reference voltage (which will typically occur during lower amplitude portions of the envelope), a control signal is delivered to the input of the amplifying device 44 that keeps the device in a non-conducting "off" state, thus de-coupling the second power source 20 from the power node 28. During this time, the first control amplifier 32 delivers a control signal to the switching device 36 that keeps the device on, thereby coupling the first power source 18 to the power node 28. The first control amplifier 32 generates the control signal based upon a comparison between the voltage on the power node 28 and the voltage of the first power source 18 reduced by the first voltage reference 34. In at least one implementation, the first voltage reference 34 will generate a slightly greater voltage than the worst case offset of the first control amplifier 32, although other values may alternatively be used.

When the negative envelope of the RF signal on the output node 22 of the power amplifier 12 reaches the reference voltage ($V_{MIN}$) (or falls slightly below the reference voltage), the second control amplifier 40 delivers a control signal to the input of the amplifying device 44 that allows current to flow from the second power source 20 to the power node 28. This current causes the voltage on the power node 28 to increase in a manner that regulates the voltage on the output node 22 at around $V_{MIN}$. The resulting increase in voltage on the power node 28 may also cause the switch circuit 14 to de-couple the power node 28 from the first power source 18 by the action of the first control amplifier 32 and the switching device 36. The feedback loop within the regulator circuit 16 may then maintain the negative envelope on the output node 22 at or around $V_{MIN}$ until the negative envelope once again rises above $V_{MIN}$. In at least one embodiment, the reference voltage ($V_{MIN}$) is selected based upon knowledge of a voltage level that may cause the power amplifier 12 to operate in a non-linear fashion. For example, when an IGFET is used within a power amplifier, as in the illustrated embodiment, the reference voltage can be selected to be at or slightly above the knee voltage of the IGFET, below which the amplifier is no longer operating in the saturation region. Other methods for selecting the reference voltage level may alternatively be used.

Figure 2:
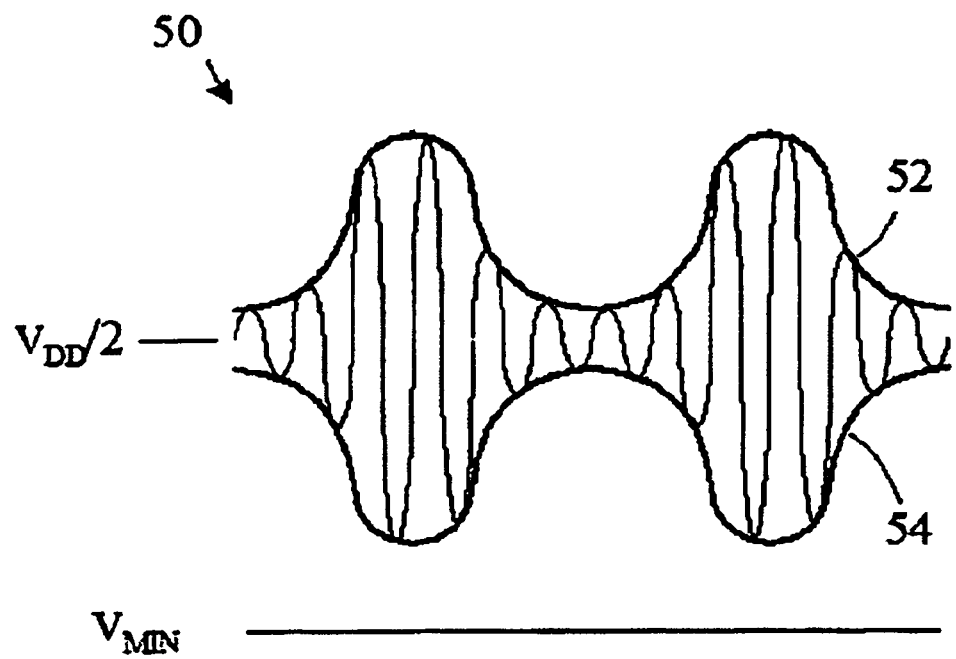
FIG. 2 is a diagram illustrating an envelope varying radio frequency (RF) signal that may occur on an output node of a power amplifier in accordance with an embodiment of the present invention.
Figure 3:
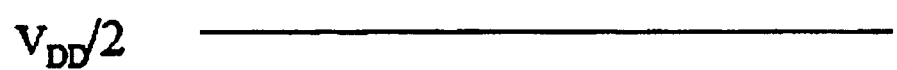
FIG. 3 is a diagram illustrating a voltage waveform that may occur on a power node of the power amplifier when the RF signal of FIG. 2 is present on the output node of a power amplifier in accordance with an embodiment of the present invention.

FIG. 2 is a diagram illustrating an envelope varying RF signal 50 that may occur on the output node 22 of the power amplifier 12 of FIG. 1. As shown, the RF signal 50 has a positive envelope 52 and a negative envelope 54 and is centered about the voltage of the first power source 18 (which is $V_{DD}/2$ in the illustrated embodiment). The RF signal 50 is an example of an output signal having a relatively low amplitude RF envelope. As illustrated, the RF signal 50 does not extend downward to the reference voltage level ($V_{MIN}$). Therefore, the power node 28 remains coupled to the first power source 18 and de-coupled from the second power source 20. FIG. 3 is a diagram illustrating the voltage waveform on the power node 28 while the RF signal 50 of FIG. 2 is on the output node 22 of the power amplifier 12. As shown, the power node voltage remains substantially constant at the potential of the first power source 18 during this period.

Figure 4:
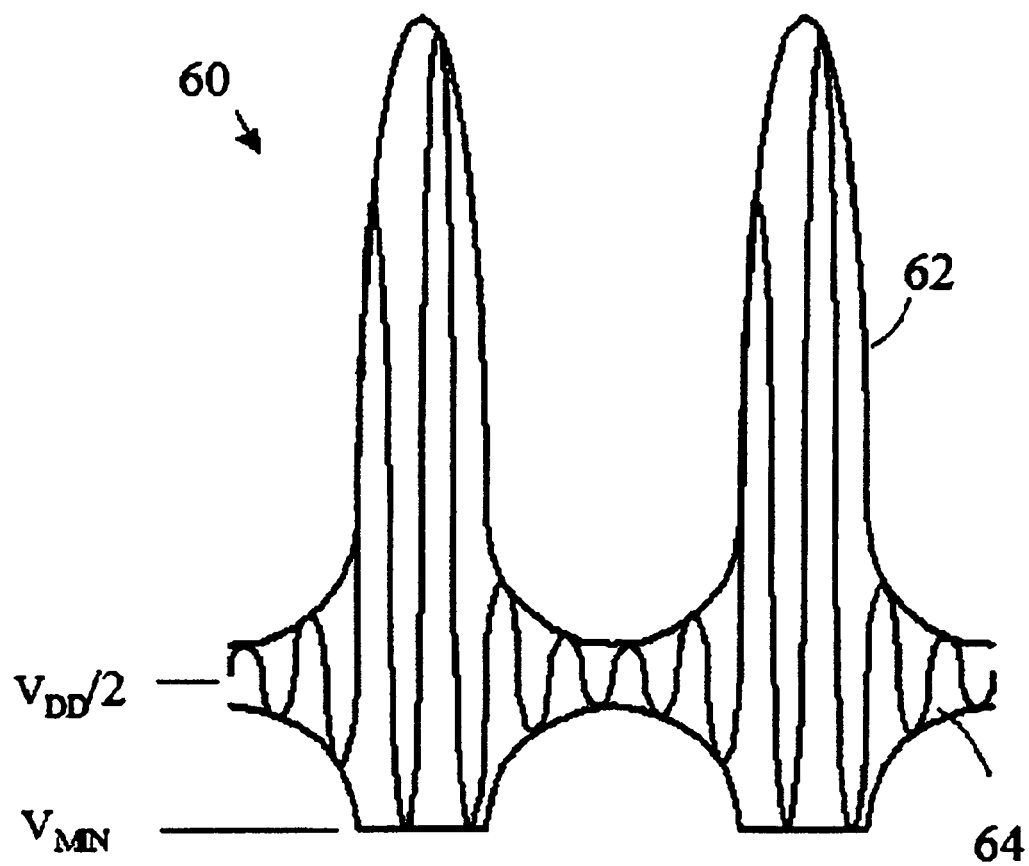
FIG. 4 is a diagram illustrating another envelope varying RF signal that may occur on an output node of a power amplifier in accordance with an embodiment of the present invention.
Figure 5:
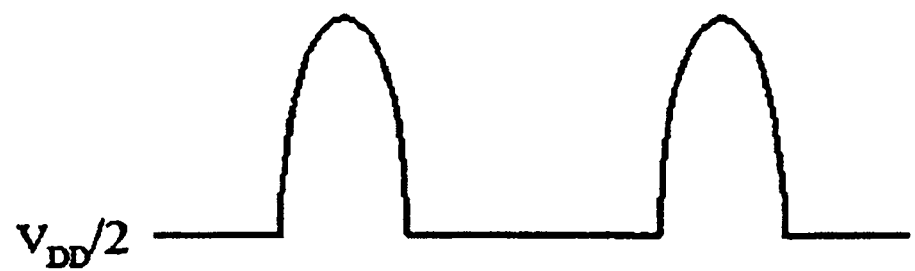
FIG. 5 is a diagram illustrating a voltage waveform that may occur on the power node of a power amplifier when the RF signal of FIG. 4 is present on the output node of the power amplifier in accordance with an embodiment of the present invention.

FIG. 4 is a diagram illustrating another envelope varying RF signal 60 that may occur on the output node 22 of the power amplifier 12 of FIG. 1. The RF signal 60 has a positive envelope 62 and a negative envelope 64. The RF signal 60 of FIG. 4 is an example of an output signal having a relatively high amplitude RF envelope. As shown, the negative envelope 64 extends downward to the reference voltage level ($V_{MIN}$) and is regulated so that it does not go below this voltage level. This is achieved by controllably coupling the power node 28 of the power amplification system 10 to the second power source 20 when the negative envelope reaches (or approaches) $V_{MIN}$. As discussed previously, the reference voltage level may be selected based upon knowledge of a voltage level below which a power amplifier will operate in a non-linear fashion (e.g., a knee voltage). FIG. 5 is a diagram illustrating the voltage waveform on the power node 28 while the RF signal 60 of FIG. 4 is on the output node 22 of the power amplifier 12. As shown, the power node voltage includes peaks that correspond to the peaks of the RF envelope. These peaks in the power node voltage act to regulate the voltage on the output node 22 as described above and may also act to preserve the informational content of the RF envelope (if any) by maintaining circuit linearity.

The power amplification system 10 of FIG. 1 uses a single-ended architecture. It should be appreciated that differential architectures may alternatively be used. For example, in one possible approach, an additional power amplifier 12 maybe connected to the power node 28 to amplify a complementary portion of a differential input signal. Another negative envelope detector 38 may also be provided to detect the envelope of the new power amplifier 12. Using a single-ended architecture, filtration techniques may be needed to recover the information of the envelope of the RF output signal. In a differential architecture, however, the envelope of the RF output signal may be reproduced without additional filtration (e.g., through the action of common mode rejection).

It should be appreciated that the RF power amplification system 10 of FIG. 1 is merely an example of one possible architecture that may be implemented in accordance with the present invention. Many alternative architectures also exist. Additional power sources and associated circuitry may also be added to achieve further efficiency increases. For example, in at least one embodiment, an additional switch circuit is provided to controllably couple the power node to a third power source having a potential between that of the first and second power sources.

Figure 6:
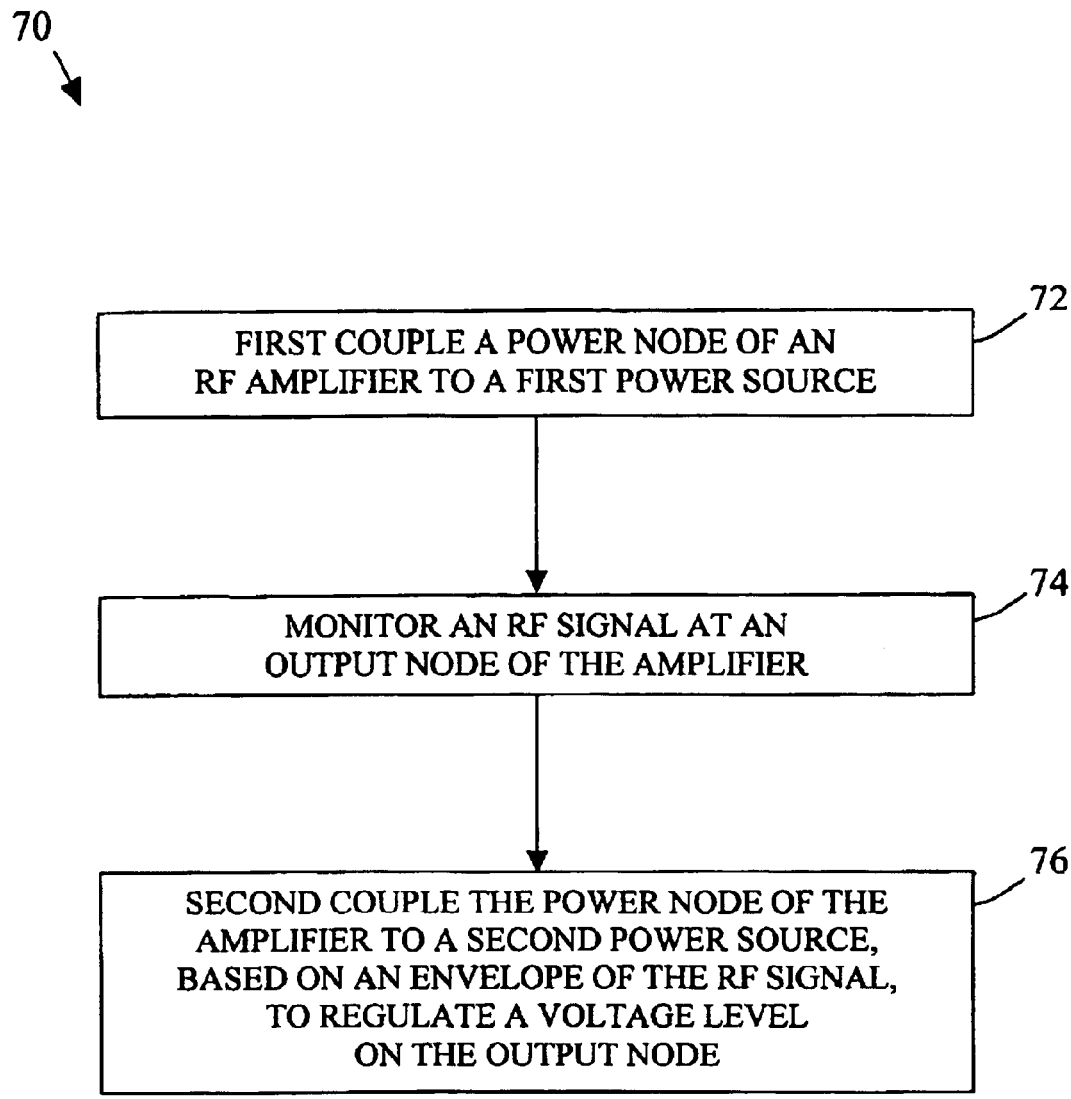
FIG. 6 is a flowchart illustrating a method for operating an RF power amplifier in accordance with an embodiment of the present invention.

FIG. 6 is a flowchart illustrating a method for operating an RF power amplifier in accordance with an embodiment of the present invention. A power node of an RF amplifier is first coupled to a first power source (block 72). An RF signal at an output node of the amplifier is monitored during operation of the amplifier (block 74). The power node may subsequently be controllably coupled to a second power source, based on an envelope of the RF output signal, in a manner that regulates a voltage level on the output node (block 76). For example, the power node may be coupled to the second power source when a negative envelope of the RF output signal meets a predetermined condition (e.g., the negative envelope reaches or transitions across a predetermined value). In at least one embodiment of the invention, the voltage value of the second power source is greater than that of the first power source. For example, the second power source may have a potential that is twice that of the first power source. Other ratios are also possible. When the power node is coupled to the second power source, current may be delivered to the power node from the second power source in a manner that increases the voltage level thereon and thereby regulates the signal level on the output node so that it does not fall substantially below a predetermined level. The power node of the amplifier may be de-coupled from first power source after the second power source begins to provide current thereto (e.g., after a voltage level on the power node has increased a predetermined amount as a result of the second power source). The power node may subsequently be de-coupled from the second power source and recoupled to the first power source based on the envelope of the RF output signal.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A radio frequency (RF) amplification system, comprising:
   a power amplifier having:
      an output node to carry an RF output signal; and
      a power node coupled to said output node through a component having a relatively high impedance at RF frequencies of said RF output signal;
   a switch circuit to controllably couple said power node to a first power source having a first potential; and
   a regulator circuit to prevent a negative envelope of said RF output signal on said output node from going substantially below a predetermined voltage level during operation of said RF amplification system by controllably coupling said power node to a second power source having a second potential in response to said negative envelope.

2. The RF amplification system of claim 1, wherein:
said second potential is greater than said first potential.

3. The RF amplification system of claim 1, wherein:
said predetermined voltage level is no less than a voltage level at which said power amplifier leaves a linear region of operation.

4. The RF amplification system of claim 3, wherein:
said power amplifier includes at least one insulated gate field effect transistor; and
said linear region of operation includes a saturation region of operation.

5. The RF amplification system of claim 1, wherein:
said switch circuit decouples said power node from said first power source when a voltage on said power node increases a predetermined amount upon coupling said power node to said second power source.

6. The RF amplification system of claim 1, wherein:
said switch circuit includes a control amplifier to compare a voltage on said power node to a predetermined voltage level.

7. The RF amplification system of claim 6, wherein:
said switch circuit includes a switching device to controllably couple said power node to the first power source in response to an output signal of said control amplifier.

8. The RF amplification system of claim 1, wherein:
said regulator circuit includes a negative envelope detector to detect said negative envelope of said RF output signal on said output node of said power amplifier.

9. The RF amplification system of claim 8, wherein:
said regulator circuit includes a control amplifier to compare said negative envelope to said predetermined voltage level.

10. The RF amplification system of claim 9, wherein:
said regulator circuit includes a device to allow current flow from the second power source to the power node in response to an output signal of the control amplifier.

11. The RF amplification system of claim 1, comprising:
at least one first power source terminal to connect said RF amplification system to the first power source.

12. The RF amplification system of claim 1, comprising:
at least one second power source terminal to connect said RF amplification system to the second power source.

13. The RF amplification system of claim 1, further comprising:

a capacitor connected between said power node and a common node, said capacitor having a relatively low impedance at RF frequencies of the RF output signal and a relatively high impedance at envelope frequencies of the RF output signal.

14. The RF amplification system of claim 1, further comprising:

a second switch circuit to controllably couple said power node to a third power source having a third potential, wherein said third potential is different from said first said second potentials.

15. The RF amplification system of claim 1, wherein:

said component having a relatively high impedance at RF frequencies of said RF output signal includes an inductor.

16. The RF amplification system of claim 1, wherein:

said component having a relatively high impedance at RF frequencies of said RF output signal has a relatively low impedance at envelope frequencies of said RF output signal.

17. A wireless transmitter, comprising:

a power amplifier having:
 an output node to carry an RF output signal; and
 a power node coupled to said output node through a component having a relatively high impedance at RF frequencies of said RF output signal;

an antenna to receive said RF output signal from said output node and to wirelessly transmit said RF output signal;

a switch circuit to controllably couple said power node to a first power source having a first potential; and a regulator circuit to prevent a negative envelope of said RF output signal on said output node from going substantially below a predetermined voltage level during operation of said wireless transmitter by controllably coupling said power node to a second power source having a second potential in response to said negative envelope.

18. The wireless transmitter of claim 17, wherein:

said antenna includes a patch antenna element.

19. The wireless transmitter of claim 17, wherein:

said antenna includes a dipole antenna element.

20. The wireless transmitter of claim 17, wherein:

said regulator circuit includes a negative envelope detector to detect said negative envelope of said RF output signal on said output node of said power amplifier.

21. The wireless transmitter of claim-20, wherein:

said regulator circuit includes an control amplifier to compare said negative envelope to said predetermined voltage level.

22. The wireless transmitter of claim 21, wherein:

said regulator circuit includes a device to allow current to flow from the second power source to the power node in response to an output signal of the control amplifier.

23. The wireless transmitter of claim 17, wherein:

said component having a relatively high impedance at RF frequencies of said RF output signal includes an inductor.

* * * * *

UNITED STATES PATENT AND TRADEMARK OFFICE
CERTIFICATE OF CORRECTION

PATENT NO. : 6,888,409 B1
DATED : May 3, 2005
INVENTOR(S) : Stewart S. Taylor

It is certified that error appears in the above-identified patent and that said Letters Patent is hereby corrected as shown below:

Column 8,
Line 19, delete "claim-20" and insert -- claim 20 --, therefor.
Line 20, after "includes" delete "an" and insert -- a --, therefor.

Signed and Sealed this

Fifth Day of July, 2005

JON W. DUDAS
*Director of the United States Patent and Trademark Office*